United States Patent [19]

Parker

[11] Patent Number: 5,658,164

[45] Date of Patent: Aug. 19, 1997

[54] FLEXIBLE FLAT ELECTRICAL CABLE CONNECTOR WITH A CONDUCTIVE SHIELD

[75] Inventor: Stephen M. Parker, High Point, N.C.

[73] Assignee: The Whitaker Corporation, Wilmington, Del.

[21] Appl. No.: 497,332

[22] Filed: Jun. 30, 1995

Related U.S. Application Data

[63] Continuation-in-part of Ser. No. 410,159, Mar. 24, 1995, abandoned.

[51] Int. Cl.[6] ........................................... H01R 9/07
[52] U.S. Cl. ........................................... 439/495; 439/497
[58] Field of Search ........................................... 439/496, 497, 439/498, 495; 174/72 A

[56] References Cited

U.S. PATENT DOCUMENTS

| | | | |
|---|---|---|---|
| 3,356,983 | 12/1967 | Johnson, Jr. | 439/497 |
| 3,462,542 | 8/1969 | Richter | 174/88 |
| 3,758,935 | 9/1973 | Long et al. | 29/203 |
| 3,920,301 | 11/1975 | Roberts et al. . | |
| 4,082,402 | 4/1978 | Kinkaid et al. . | |
| 4,130,334 | 12/1978 | Anderson . | |
| 4,130,934 | 12/1978 | Asick et al. | 29/628 |
| 4,149,026 | 4/1979 | Fritz et al. | 174/32 |
| 4,152,826 | 5/1979 | Mueller | 29/624 |
| 4,172,626 | 10/1979 | Olsson . | |
| 4,287,385 | 9/1981 | Dombrowsky | 174/36 |
| 4,326,764 | 4/1982 | Asick et al. . | |
| 4,357,065 | 11/1982 | Kam et al. . | |
| 4,455,818 | 6/1984 | Sugimoto et al. | 57/293 |
| 4,714,436 | 12/1987 | Jones | 439/497 |
| 4,721,483 | 1/1988 | Dickie | 439/497 |
| 4,786,257 | 11/1988 | Tengler | 439/76 |
| 4,902,236 | 2/1990 | Hasircoglu | 439/77 |
| 4,971,574 | 11/1990 | Garcia | 439/497 |
| 5,044,980 | 9/1991 | Krumme et al. | 439/496 |
| 5,051,544 | 9/1991 | Harris | 174/117 F |
| 5,174,782 | 12/1992 | Bogiel et al. | 439/404 |
| 5,192,833 | 3/1993 | Gibson | 439/495 |
| 5,306,659 | 4/1994 | Beyer et al. | 437/64 |
| 5,324,683 | 6/1994 | Fitch et al. | 437/65 |
| 5,328,868 | 7/1994 | Conti et al. | 437/203 |

*Primary Examiner*—Gary E. Elkins

[57] ABSTRACT

A 360 degree shielded jumper connection using flat and flexible electrical cable is used. The cable has multiple signal conductors imbedded in an insulation layer, a broad flexible ground conductor overlaying a first section of the insulation layer, and a shield overlaying a second section of the insulation layer and the ground conductor. The ends of the signal conductors project beyond a cut end of the insulation for mating the signal conductors with a female type electrical connector. The insulation projects beyond a cut end of the shield. The ground conductor also projects beyond a cut end of the shield. A shield can encircles the cut end of the shield. And a ground strap pick up tab on the shield can contacts the projecting ground conductor to provide a 360 degree shielded jumper connection.

13 Claims, 7 Drawing Sheets

FLEXIBLE FLAT ELECTRICAL CABLE CONNECTOR WITH A CONDUCTIVE SHIELD

This application is a continuation-in-part of application Ser. No. 08/410,159 filed Mar. 24, 1995, now abandoned.

FIELD OF THE INVENTION

The invention relates to a flexible flat electrical cable, and, more particularly, to a 360 degree conductive shielded flexible flat electrical cable with the projection signal conductors becoming a male type micro-ribbon plug end when placed in micro-ribbon connector.

BACKGROUND OF THE INVENTION

A jumper connection on the end of a flexible flat electrical cable is known from U.S. Pat. No. 4,172,626. The cable has exposed and bared conductors that are frictionally engaged by respective electrical terminals, and a stiffener holds the cable while the conductors of the cable are engaged against the terminals.

A flexible flat electrical cable comprises, multiple electrical conductors that extend along a continuous ribbon. The cross sections of the conductors can be round or flat, according to U.S. Pat. No. 4,287,385, and U.S. Pat. No. 4,149,026.

According to U.S. Pat. No. 5,051,544, both signal conductors and the ground conductors extend side by side in the same plane. A short piece of insulation is inserted in the cable. The signal conductors pass under the short piece of insulation. The ground conductors extend over the short piece of insulation. The short piece of insulation elevates the ground conductors from the remainder of the cable to improve access to the ground conductors.

U.S. applications, Ser. No. 08/338,931 and Ser. No. 08/338,920, both filed Nov. 14, 1995, disclose jumper connections. The signal conductors are coplanar in a pitch spacing sequence with a signal conductor absent from at least one of the pitch spacings. The ground conductors lie within the absent pitch spacing when the insulation is cut away and the signal conductors are to be contacted with an electrical terminal. Thus, the ground conductor is in the same plane as the signal conductor when the conductors extend beyond the insulation. A difficulty with this flat, flexible jumper connection and other flat, flexible cables resides in using specially designed tools to create a connection. Furthermore, this jumper connection type is mated to a low insertive force connector or a zero force connector on the printed circuit boards and, as such, fails to provide 360 degree shield protection through the connector to the printed circuit board.

The problem to be solved is to create a 360 degree shielded jumper connection with a flat, flexible cable, and without crimps or staples that increase costs.

SUMMARY OF THE INVENTION

According to an aspect of the invention that solves the identified problem, a 360 degree shielded jumper connection uses flat and flexible electrical cable. The cable has multiple signal conductors imbedded in an insulation layer, a broad flexible ground conductor overlaying a first section of the insulation layer, and a shield overlaying a second section of the insulation layer and the ground conductor. Projecting ends of the signal conductors project beyond an end of the insulation for mating the signal conductors with a female type electrical connector. A projecting end of the insulation projects beyond a cut end of the shield. An end of the ground conductor projects beyond the cut end of the shield. A shield can encircles the cut end of the shield. And a ground strap pick up tab on the shield can contacts the projecting end of the ground conductor to provide a 360 degree shielded jumper connection.

DESCRIPTION OF THE DRAWINGS

Embodiments of the invention will now be described with reference to the accompanying drawings, according to which.

DETAILED DESCRIPTION OF THE INVENTION

Figure 1:
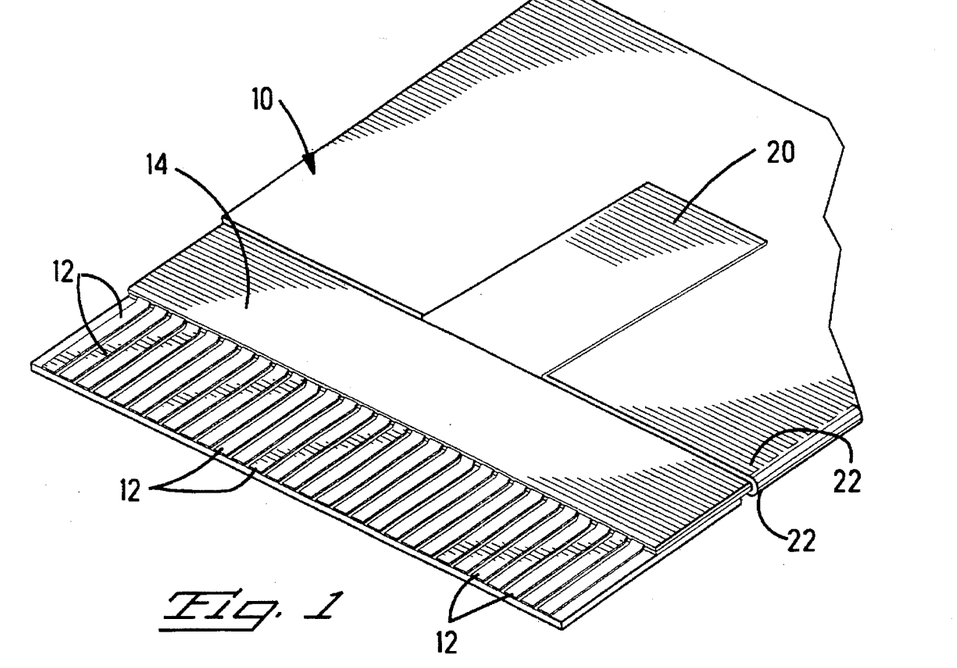
FIG. 1 is a fragmentary perspective view of a jumper connector on an electrical cable, cut to length and ready for termination.
Figure 2:
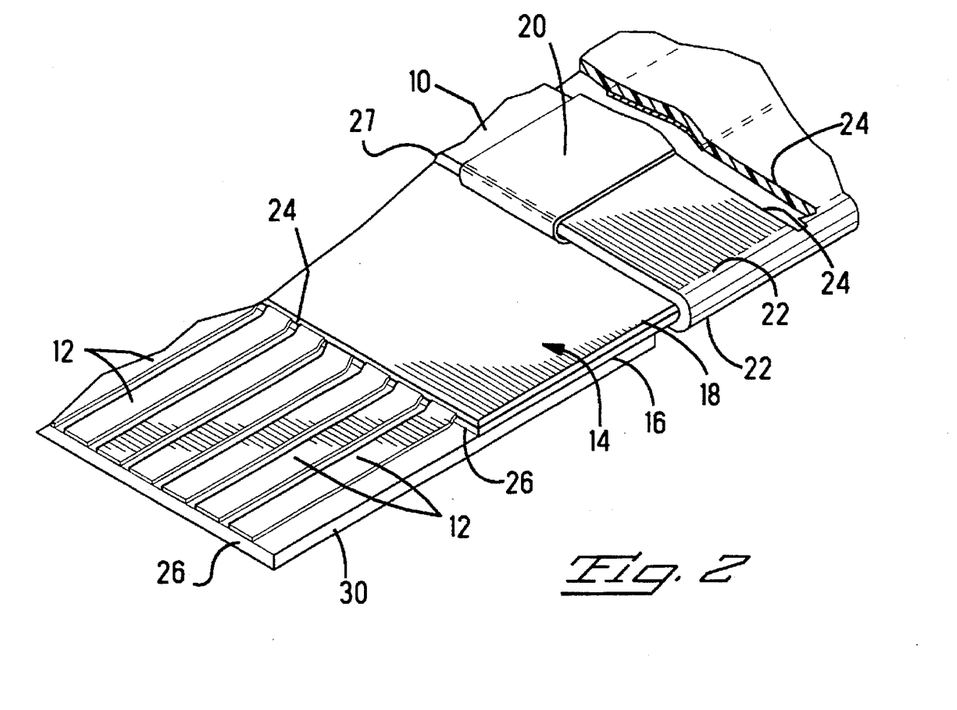
FIG. 2 is a view similar to FIG. 1 and enlarged.
Figure 3:
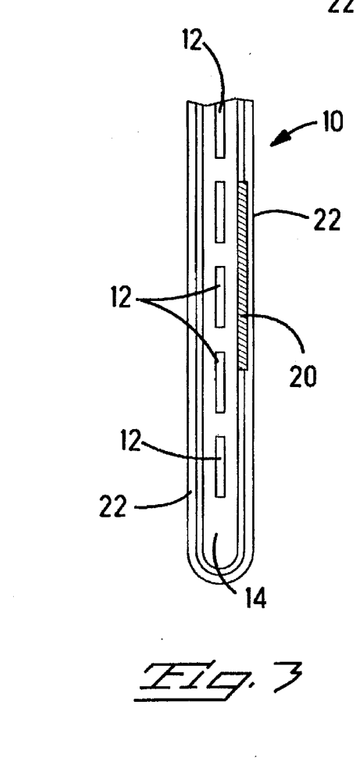
FIG. 3 is an end view of a portion of the jumper connector shown in FIG. 4.

With reference to FIGS. 1 and 2, a jumper connection 10 comprises multiple, flexible, and flat signal conductors 12 extending along a flexible ribbon of insulation 14. For example, the signal conductors 12 are illustrated as being flat and rectangular. With reference to FIGS. 2 and 3, the signal conductors 12 can either be imbedded in the insulation 14 that is a layer of unitary construction, as shown in FIG. 3, or be in insulation 14 that comprises a composite layer of two thin layers 16, 18, as shown in FIG. 2. The two layers 16, 18 could be bonded together by fusion melting or by an adhesive, not shown.

Figure 4:
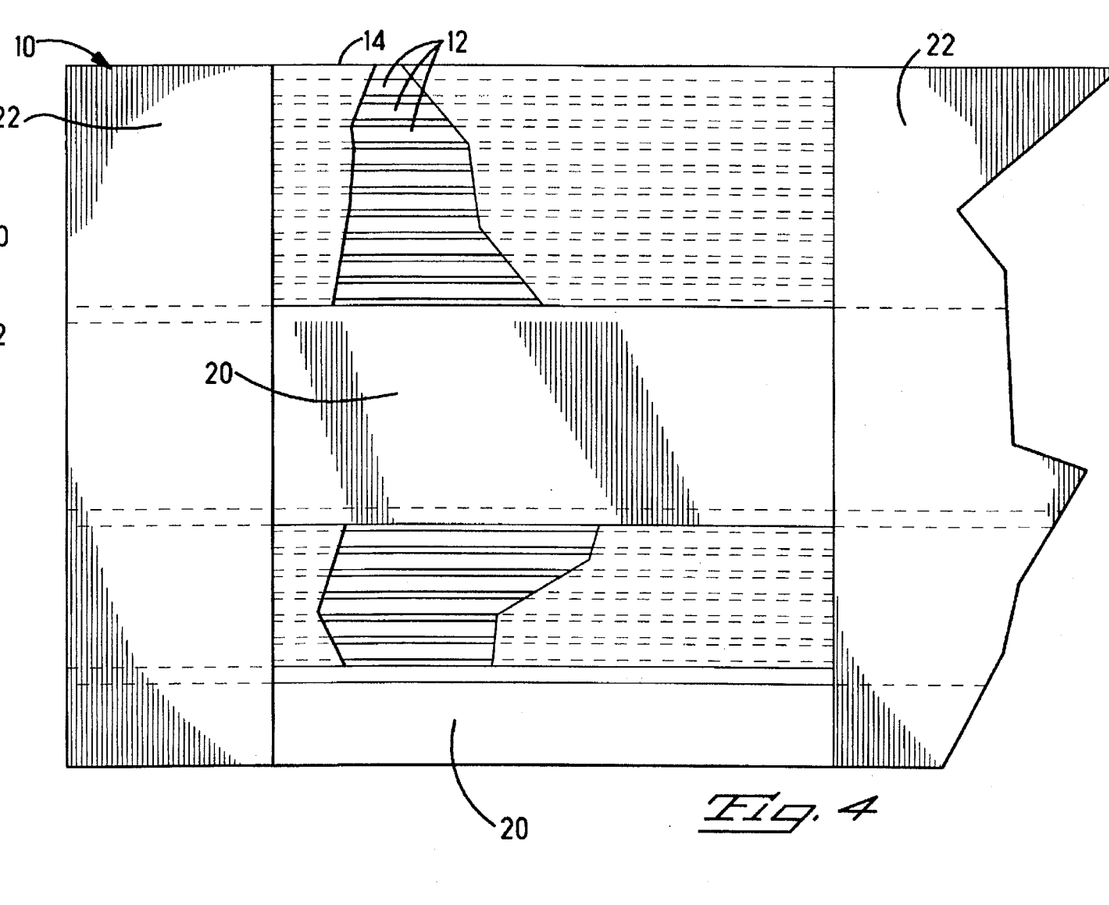
FIG. 4 is a fragmentary top view of the jumper connector shown in FIG. 1 prior to being cut to length, and shown with parts cut away.
Figure 5:
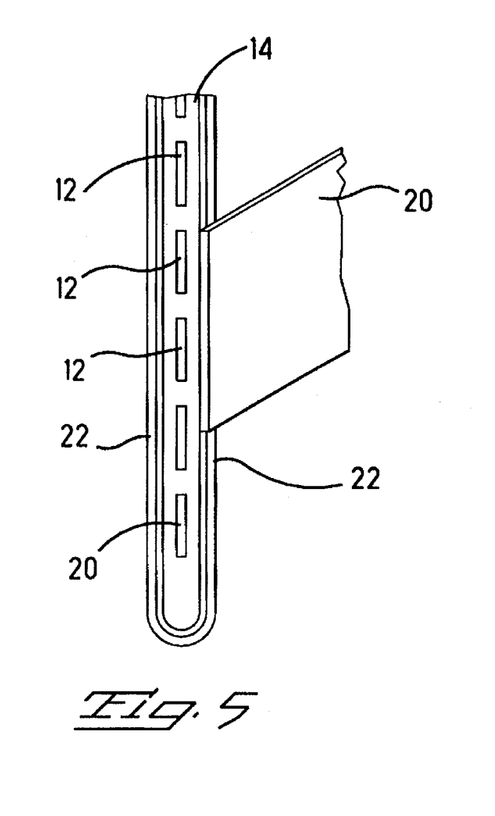
FIG. 5 is an end view of a portion of a jumper connector shown in FIG. 4.

With reference to FIGS. 1, 2, and 4, at least one ground conductor 20 overlays a first section of the insulation 14. FIG. 4 shows additional ground conductors laid over first sections of the insulation 14. The signal conductors 12 are coplanar within a first plane. The insulation 14 is in a second plane. Each said ground conductor 20 is in a third plane that is separated from the plane of the signal conductors 12. The signal conductors 12 are spaced apart on pitch spacings, meaning that the longitudinal axes of the signal conductors 12 extend along spaced apart, consecutive centerlines. The ground conductor 20 and a second section of the insulation 14 is overlayed by a flexible and flat shield 22 forming a separate layer.

The flexible and flat shield 22 comprises a laminate of a conductive adhesive and a flexible and flat conductive metal. The conductive metal can be any standardized metal foil, fabric like Kevlar interspaced with metal, metalized paint or metalized inks. The shield 22 wraps around an exterior of the insulation 14. This insulation 14 separates the shield 22 from the signal conductors 12 extending within the insulation 14. The shield 22 is adhered to, and electrically connected to, each said ground conductor 20.

Figure 6:
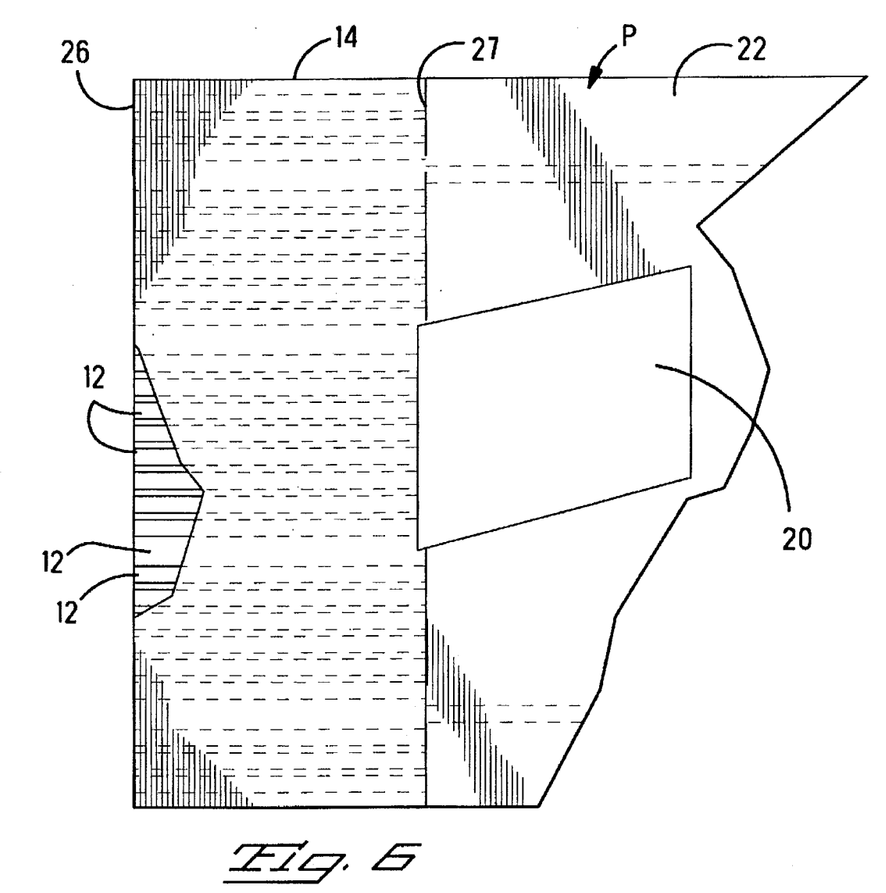
FIG. 6 is a top view of a portion of a jumper connector with parts cut away.
Figure 7:
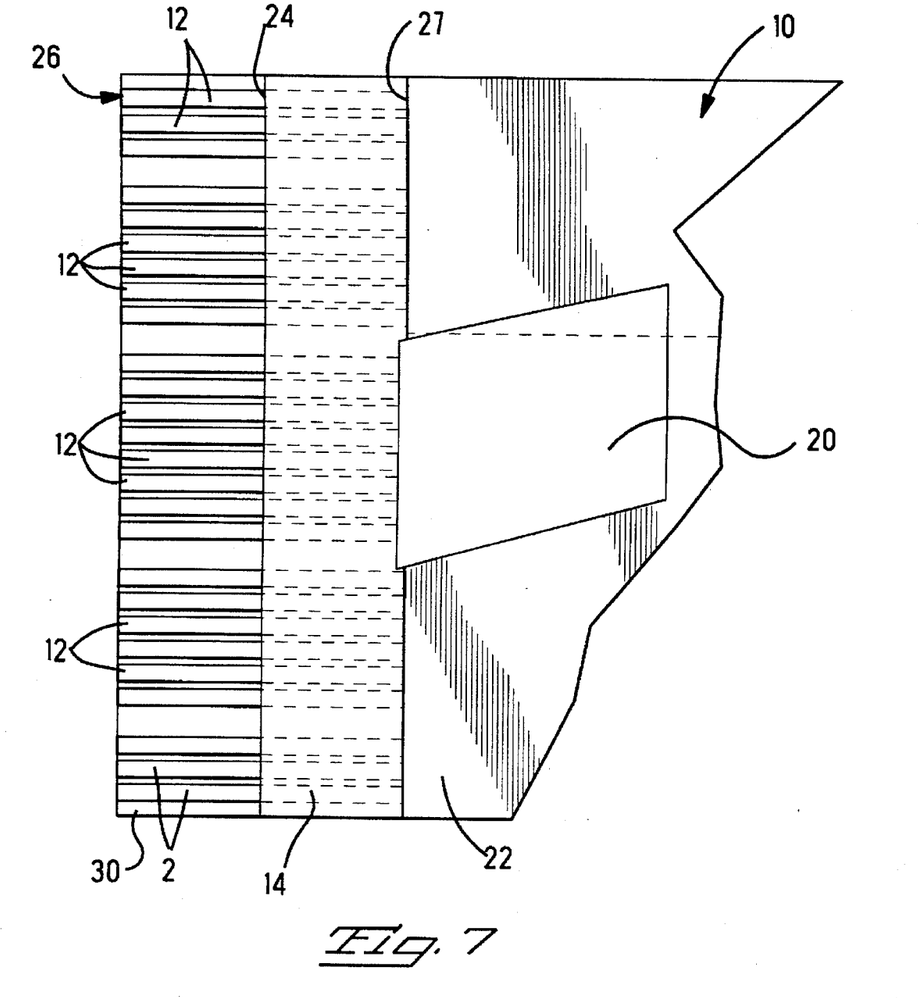
FIG. 7 is a top view of a portion of a jumper connector.
Figure 8:
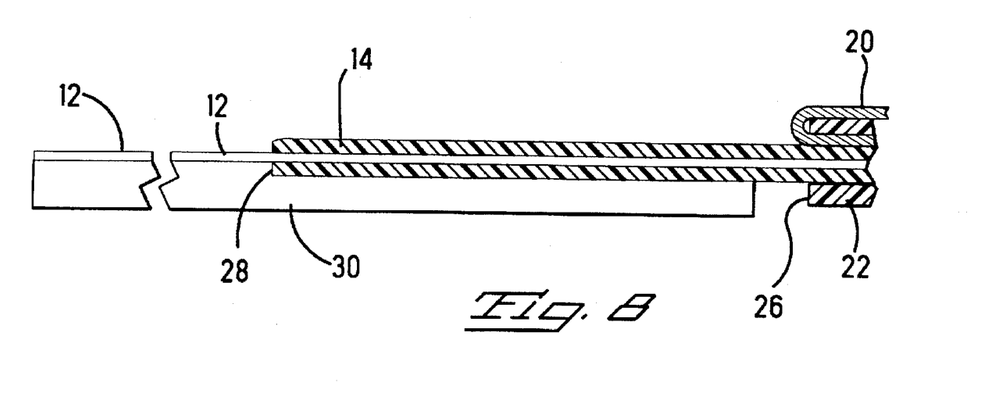
FIG. 8 is a section view of a portion of a jumper connector shown in FIG. 6.

With reference to FIGS. 2, 6, and 7, the cable 10 is severed to provide a cut end 26. The shield 22 is severed at cut end 27. The insulation 14 is severed at cut end 24 revealing exposed and bared ends of the signal conductors 12. See FIGS. 2 and 7. Thereby with reference to FIGS. 2 and 7, the signal conductors 12 project from the insulation 14 which projects from the shield 22. The ground conductor 20, however, must extend beyond the shield cut end 27. Moreover, the ground conductor 20 can be folded back at shield cut end 27 to prevent contact with the signal conductors 22.

In another embodiment of the invention not shown, the ground conductor 20 is merely cut back to not extend beyond insulation cut area 24, thereby preventing the ground conductor 20 from contacting the bared ends of the signal conductors 12.

Figures 9, 10, 11:
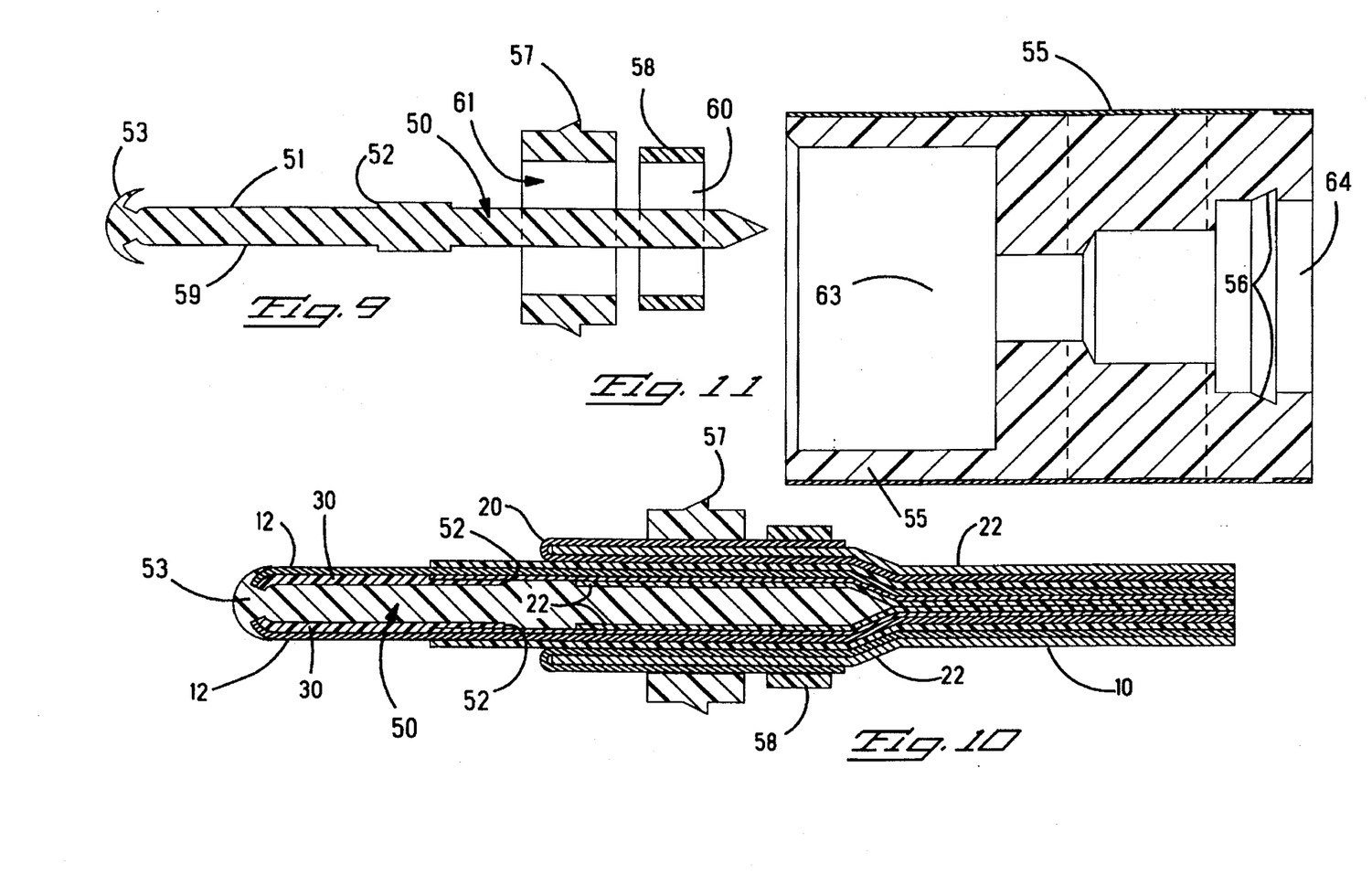
FIG. 9 is a section view of a portion of an empty double row holder carrier.
FIG. 10 is a section view of signal conductors upon a stiffener slipped into the carrier holder shown in FIG. 9.
FIG. 11 is a cross section view of a shield.

As shown in FIGS. 1 and 2, the bared end of the signal conductors 12 extend on the pitch spacings in a common plane. The bared ends of the signal conductors 12 are laminated to a stiffener 30, for example, comprising a plate of insulation. The bared end of the signal conductors 12 on a stiffener 30 comprise electrical contacts ready to be slid into a carrier holder 50, that is shown in FIG. 9 and 10.

The carrier holder 50 comprises a groove 51 on a centerplane board 59. The groove 51 is designed to receive the laminated stiffener 30. This carrier holder 50 also comprises a rear wall 52 and front wall 53 on the front side of the centerplane board 59 to resist front and rear movement of the laminated stiffener 30. Moreover, this carrier holder 50 comprises a rear sidewall 58 and a spur wall 57 near the rear of the centerplane board 57. Both the spur wall 59 and the rear sidewall 58 comprise at least two walls which are attached to the same planar side of the centerplane board 59 and have at least a partial overhanging arm. The rear sidewall 58 prevents the carrier holder 50 from shifting side to side when inserted into a shield can 55. The rear sidewall 58 also comprises a space 60 which allows the flat, flexible cable to be inserted under the rear sidewall 58 overhanging arm. Similarly, the spur wall 57 has a space 61 which allows the flat, flexible cable to be inserted under the spur wall 57 overhanging arm.

The present embodiment comprises projecting signal conductors 12 of a flat, flexible cable laminated to a stiffener 30 and placed securely in a carrier holder 50 without using any crimps or staples. Since the signal conductors 12 are supported by the stiffener 30, and the signal conductors 12 and stiffener 30 are secured in position by the carrier holder 50, each of the signal conductors 12 can frictionally engage with a female type electrical terminal, not shown, of another mating electrical connector, not shown, without being dislodged. This present embodiment when it is in the carrier holder 50 comprises a plug type ribbon connector.

The flat flexible cable can have various centerline spacings and rows depending on what type of micro-ribbon is necessary. Thus for example, the present embodiment as illustrated in FIG. 10 can be two cables with signal conductors 12 at 0.089" pitch spacing for a CHAMP® male type connector, two cables with signal conductors 12 at 0.50" for a CHAMP 0.50"® male type connector, or two cables with signal conductors 12 at 0.8 mm for a mini CHAMP® male type connector. Although the embodiment illustrates two cable systems, the present embodiment can also be used with one signal conductor cable, for example one cable with signal conductors 12 at 0.050" for an Infoport 1® male type connector.

Figure 11B:
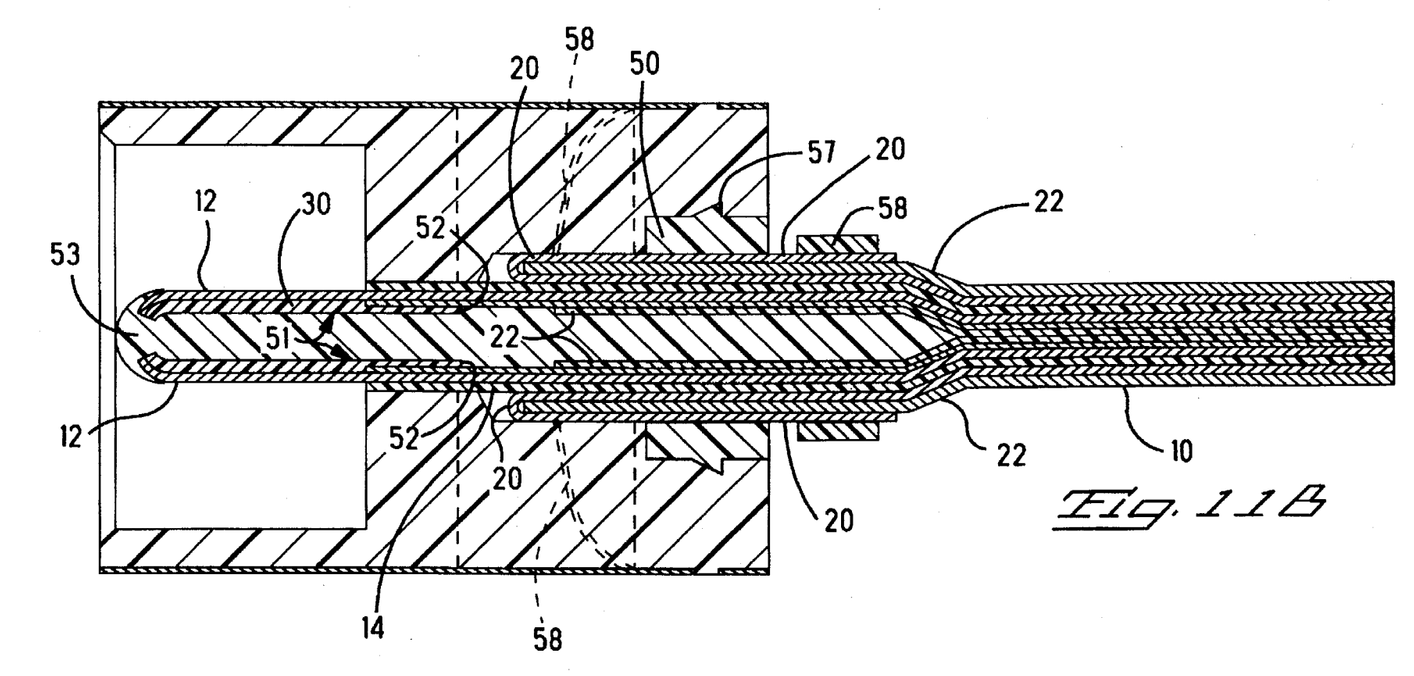
FIG. 11B is a section view of the structures shown in FIG. 10 and FIG. 11.
Figure 13:
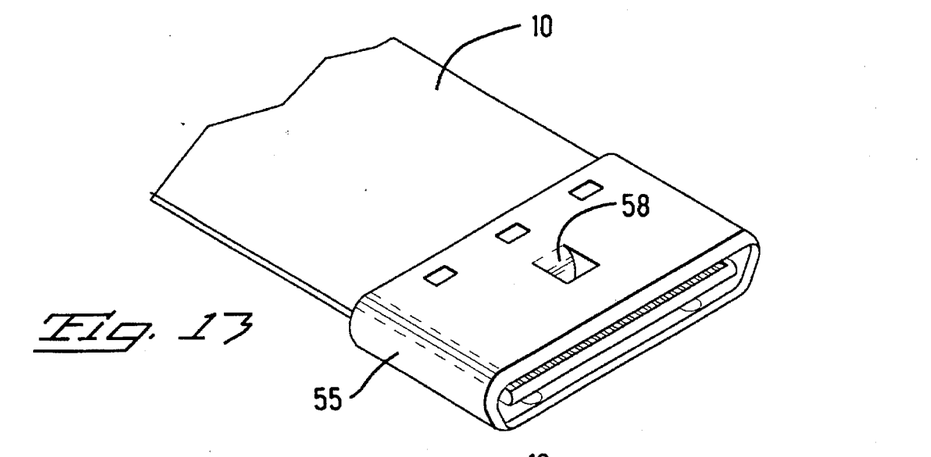
FIG. 13 is an isometric view of the jumper connector in a shield can.

To insure a 360 degree shielded jumper connection, the present embodiment comprises a shield can 55. The shield can 55, as shown in FIG. 11b, encircles and engages the cut end of the shield 22, which is at the cut end 27. The shield can 55 has a ground strap pick up tab 58, as illustrated in FIG. 13. The ground strap pick up tab 58 is pressed inwardly to an extent wherein the ground strap pick up tab 58 is in contact with the ground conductor 20. Thereby creating a 360 degree shielded flexible jumper cable with a ribbon plug-end that can be joined to any appropriate mating connector, such as that illustrated in U.S. Pat. No. 3,758,935 in the opening 63 in the mating end of shield can 55.

Figure 12:
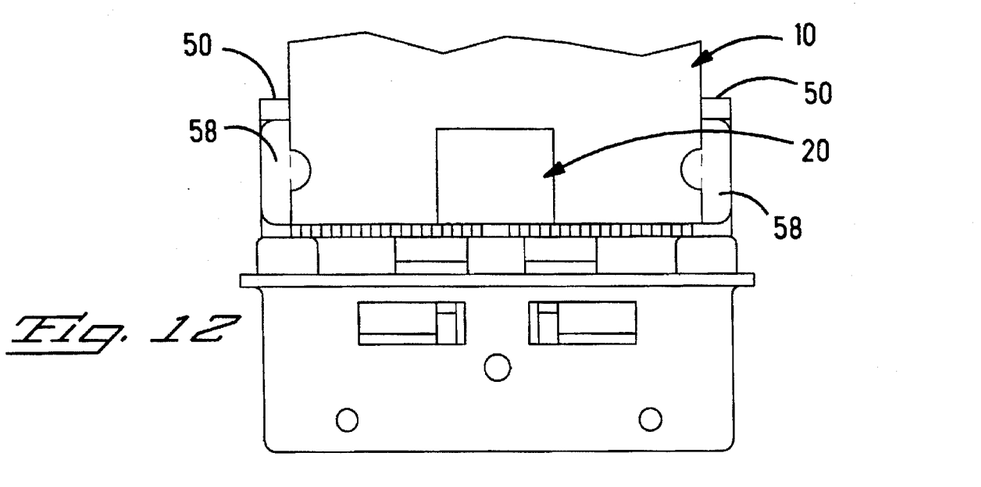
FIG. 12 is a top view of the jumper connector in the shield.

As illustrated in FIGS. 11 and 11B, the shield can 55 also has a detent 56 and formed opening 64. The detent 56 and formed opening 64 on the shield can 55 secures the carrier holder 50 into formed opening 64 of the shield can 55 by having the detent 56 and the spur wall 57 on the carrier holder 50 snapped together, securing the carrier holder 50 into the shield can 55. Within the carrier holder 50 there is also the rear sidewall 58 that prevents the carrier holder 50 from shifting when inserted into the shield can 55. See FIGS. 10 and 12.

Figure 14:
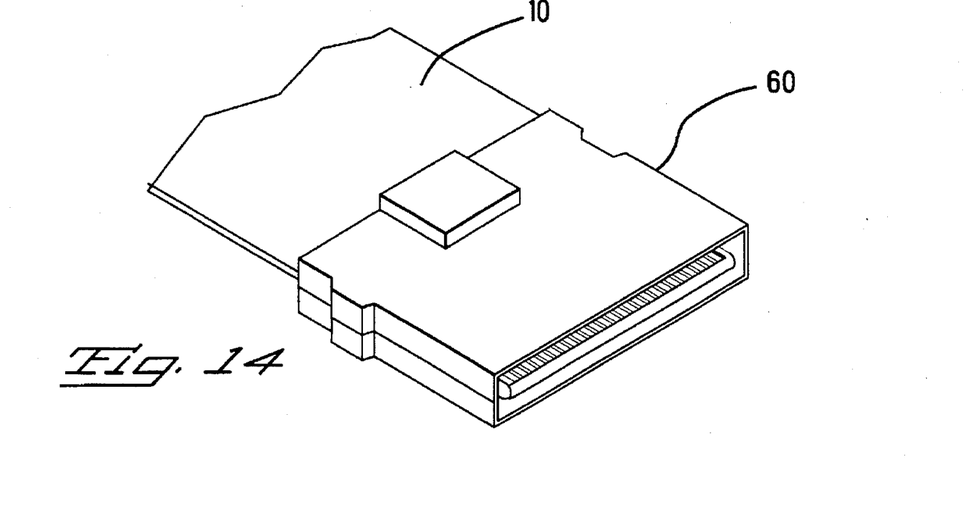
FIG. 14 is an isometric view of the jumper connector encased in a cover.

In another embodiment of this invention, the shield can 55 can be encased by a non-conductive overmolded or snapped on cover 60. See FIG. 14

This present invention provides a rugged, shielded, single or double row flat flexible jumper cable that does not require special tools like crimps and can easily connect/mate with standard ribbon products. Such products include but are not limited to pc board type products.

Many changes, modifications, variations, and other uses and applications of the subject invention will, however, become apparent to those skilled in the art after considering the specification and the accompanying drawings which disclose preferred embodiments thereof. All such changes, modifications, variations, and other uses and applications which do not depart from the spirit of the invention are deemed to be covered by the invention which is limited only by the claims that follow.

I claim:

1. A 360 degree shielded jumper connection using flat and flexible electrical cable comprising:

multiple signal conductors imbedded in an insulation layer;

a broad flexible ground conductor overlaying a first section of said insulation layer;

a shield overlaying a second section of said insulation layer and said ground conductor;

and wherein:

projecting ends of said signal conductors extend beyond a cut end of said insulation for mating said signal conductors with a female type electrical connector;

a projecting end of said insulation extends beyond a cut end of said shield;

a projecting end of said ground conductor extends beyond a cut end of said shield;

a shield can encircles said cut end of shield; and a ground strap pick up tab on said shield can contacts said end of ground conductor to provide a 360 degree shielded jumper connection.

2. A jumper connection according to claim 1 wherein a stiffener is laminated to said projecting ends of said signal conductors.

3. A jumper connection according to claim 2 wherein a carrier holder underlays said stiffener.

4. A jumper connection according to claim 3 wherein said carrier holder comprises at least a groove to recieve said stiffener, and a front wall and a rear wall to secure said stiffener.

5. A jumper connection according to claim 4 wherein a spur wall of said carrier holder connects to a detent inside said shield can.

6. A jumper connection according to claim 1 wherein said signal conductors are coplanar.

7. A jumper connection according to claim 1 wherein said signal conductors are pitch spaced in a common plane.

8. A jumper connection according to claim 1 wherein conductive adhesive secures said ground conductor and said second section of said insulation to said shield.

9. A jumper connection according to claim 1 wherein said terminated ground conductor is in a different plane than said terminated signal conductors.

10. A jumper connection according to claim 1 wherein said terminated ground conductor is folded back to prevent contact with said signal conductors.

11. A jumper connection according to claim 1 wherein a cover encases said shield can.

12. A jumper connection according to claim 1 wherein said insulation layer is a unitary construction.

13. A jumper connection assorcing to claim 1 wherein said insulation layer is a composite layer of two layers.

* * * * *